US010181794B1

(12) United States Patent
Chang et al.

(10) Patent No.: US 10,181,794 B1
(45) Date of Patent: Jan. 15, 2019

(54) TWO-STAGE MULTI-PHASE SWITCH-MODE POWER CONVERTER WITH INTER-STAGE PHASE SHEDDING CONTROL

(71) Applicant: DIALOG SEMICONDUCTOR (UK) LIMITED, London (GB)

(72) Inventors: Kevin Yi Cheng Chang, Chandler, AZ (US); James Doyle, Chandler, AZ (US); Erik Mentze, Chandler, AZ (US)

(73) Assignee: DIALOG SEMICONDUCTOR (UK) LIMITED, London (GB)

( * ) Notice: Subject to any disclaimer, the term of this patent is extended or adjusted under 35 U.S.C. 154(b) by 0 days.

(21) Appl. No.: 16/047,645

(22) Filed: Jul. 27, 2018

(51) Int. Cl.
 *H02M 1/084* (2006.01)
 *H02M 3/158* (2006.01)
 *H02M 1/42* (2007.01)
 *H02M 3/28* (2006.01)
 *G05F 1/575* (2006.01)
 *H02M 1/00* (2006.01)

(52) U.S. Cl.
 CPC .......... *H02M 3/1584* (2013.01); *G05F 1/575* (2013.01); *H02M 1/084* (2013.01); *H02M 1/4208* (2013.01); *H02M 3/285* (2013.01); *H02M 2001/007* (2013.01); *H02M 2001/0009* (2013.01); *H02M 2001/0012* (2013.01); *H02M 2001/0032* (2013.01); *H02M 2003/1586* (2013.01); *H03F 2200/351* (2013.01)

(58) Field of Classification Search
 CPC .... H02M 3/157; H02M 3/158; H02M 3/1584; H02M 3/285; H02M 1/08; H02M 1/4208; H02M 1/084; H02M 2003/1586; G05F 1/575
 See application file for complete search history.

(56) References Cited

U.S. PATENT DOCUMENTS

| 6,362,608 B1* | 3/2002 | Ashburn | H02M 3/1584 323/272 |
|---|---|---|---|
| 8,134,353 B2* | 3/2012 | Chen | H02M 3/1584 323/241 |
| 9,606,559 B2* | 3/2017 | Ozawa | G05F 1/575 |
| 9,755,517 B2* | 9/2017 | Kobayashi | H02M 3/158 |
| 2006/0152205 A1* | 7/2006 | Tang | H02M 3/1584 323/284 |
| 2007/0262759 A1* | 11/2007 | Burton | H02M 3/1584 323/272 |

(Continued)

OTHER PUBLICATIONS

Jia Wei and Fred C. Lee, "Two-Stage Voltage Regulator for Laptop Computer CPUs and the Corresponding Advanced Control Schemes to Improve Light-Load Performance," IEEE Applied Power Electronics Conference and Exposition, 2004. APEC '04.

(Continued)

*Primary Examiner* — Adolf Berhane
(74) *Attorney, Agent, or Firm* — Haynes and Boone, LLP

(57) ABSTRACT

A two-stage multi-phase switching power converter operates its first stage during nominal operation responsive to a nominal clocking frequency and operates its second stage during the nominal operation responsive to a second-stage clocking frequency that is greater than the nominal clocking frequency. In response to an application of a load, the first stage temporarily increases its clocking frequency from the nominal clocking frequency and implements a fixed duty cycle.

19 Claims, 6 Drawing Sheets

(56) References Cited

U.S. PATENT DOCUMENTS

| | | | |
|---|---|---|---|
| 2008/0157742 A1* | 7/2008 | Martin | H02M 3/1584 323/284 |
| 2010/0194361 A1* | 8/2010 | Hardman | H02M 3/1584 323/282 |
| 2011/0188218 A1* | 8/2011 | Hsing | H01R 9/00 361/772 |
| 2015/0288285 A1* | 10/2015 | Paul | H02M 3/158 323/271 |
| 2016/0197552 A1* | 7/2016 | Giuliano | H02M 3/07 363/60 |
| 2018/0013347 A1* | 1/2018 | Paul | H02M 3/1584 |
| 2018/0145594 A1* | 5/2018 | Akre | H02M 3/00 |

OTHER PUBLICATIONS

J. Sun, M. Xu, Y. Ying, and F. Lee, "High power density, high efficiency system two-stage power architecture for laptop computers," in Power Electronics Specialists Conference, Jun. 18-22, 2006, pp. 1-7.

Robert C.N. Pilawa-Podgurski and David J. Perreault, "Merged Two-Stage Power Converter with Soft Charging Switched-Capacitor Stage in 180 nm CMOS," IEEE Journal of Solid-State Circuits, vol. 47, No. 7, pp. 1557-1567, Jul. 2012.

Julian Yan Zhu and Brad Lehman, "Control loop design for two-stage DC-DC converters with low voltage/high current output," Applied Power Electronics Conference and Exposition, 2003. APEC '03. Eighteenth Annual IEEE.

A. Costabeber, P. Mattavelli, and S. Saggini, "Digital Time-Optimal Phase Shedding in Multiphase Buck Converters," IEEE Transactions on Power Electronics, vol. 25, No. 9, Sep. 2010, pp. 2242-2247.

* cited by examiner

US 10,181,794 B1

TWO-STAGE MULTI-PHASE SWITCH-MODE POWER CONVERTER WITH INTER-STAGE PHASE SHEDDING CONTROL

TECHNICAL FIELD

This application relates to switching power converters, and more particularly to a two-stage multi-phase switching power converter with inter-stage phase shedding control.

BACKGROUND

A typical computing power supply for laptops and related devices such as tablets uses a combination of Lithium Ion (Li-Ion) batteries, usually arranged in groups of two cells in series that produces a maximum voltage of approximately 10V. Such a relatively high power supply voltage is unsuitable for modern integrated circuits so these devices conventionally include a buck converter to regulate the battery power supply voltage from the series-connected batteries to an internal power supply voltage such as 1V for powering the integrated circuits within the devices.

A single stage multi-phase buck converter would require high voltage components to step down from such a relatively high battery power supply voltage to the relatively low internal power supply voltage. The use of such high voltage components demands substantial die space to achieve suitable drain-to-source resistance and also leads to higher gate drive losses and voltage-current overlap switching losses for the power switches. Thus, single stage multi-phase buck converters are not very efficient in applications in which the output voltage is substantially stepped down from, for example, around 10V to 1V.

To improve the efficiency and increase density, two-stage multi-phase DC/DC power converters have been developed in which a first stage multi-phase buck converter drives a second stage multi-phase buck converter with an intermediate voltage. The second stage multi-phase buck converter regulates the output voltage using the intermediate voltage as an input power supply. The second stage may use high-speed core transistors since the intermediate voltage is reduced as compared to the relatively-high battery voltage. Although such two stage voltage regulators have desirable efficiency and density in theory, their conventional implementation suffers from a number of problems. For example, efficiency is improved if the switching speed of the first stage multi-phase buck converter is considerably slower (e.g., 1%) than the switching speed of the second stage multi-phase buck converter. The relatively low speed of the first stage buck converter prevents it from adequately responding to sudden load increases or decreases.

Accordingly, there is a need in the art for multi-phase buck converters with improved response speeds.

SUMMARY

A phase-shedding scheme for a first stage in a two-stage multi-phase buck converter is disclosed that responds to changes in load by changing the number of active phases accordingly. During nominal operation prior to the load application, the switching frequency for the pulse-width modulation in the first stage is controlled by a nominal clock signal having a nominal clock frequency. Should the application of the load exceed a threshold, nominal operation is ceased during a phase-shedding transition for the first stage in which additional phases are activated. During an initial transition period for the phase-shedding transition, the switching frequency for the pulse-width modulation in the active phases for the first stage is instead responsive to a high-frequency clock signal having a high clock frequency that is greater than the nominal clock frequency. Not only is the clocking frequency changed during this transition period but the duty cycle for the pulse width modulation is set through an open-loop control to equal a fixed relatively large value such as 100% duty cycle, a 95 duty cycle, or a 90% duty cycle. In contrast, the duty cycle for the pulse-width modulation during nominal operation is controlled in a conventional closed-loop fashion responsive to feedback for the output voltage for the first stage. But during open-loop operation, the duty cycle is instead set to a fixed relatively large value that is not responsive to feedback for the output voltage. The application of the load will cause the output voltage from the first stage (which functions as the input voltage to the second stage) to drop below its steady-state or nominal-operation value. To prevent the output voltage from the first stage from being driven out of regulation by the open-loop high-speed operation in the transition period, the transition period is terminated in response to the output voltage recovering sufficiently with regard to its steady-state value.

The resulting closed-loop and open-loop control of the switching in the first stage is quite advantageous in that the first stage can have the efficiency of relatively slow clocking during nominal operation yet can quickly respond to load applications. These advantageous features may be better appreciated through a consideration of the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To speed the response speed, a phase shedding control scheme for a two-stage multi-phase switching power converter is disclosed in which a first stage responds to a phase shedding transition (increase in the number of active phases) for the second stage by increasing the first stage clocking frequency and changing the number of active phases proportionally to the number of phases for the phase shedding transition in the second stage. The increased clocking frequency for the first stage is applied during a transition period during which the duty cycle for the active phases is increased in an open-loop mode of operation. As used herein, an "open-loop mode of operation" for the first stage refers to an implementation of a duty cycle for the pulse-width modulation of the switching in the active phases that does not depend upon feedback regarding the intermediate output voltage from the first stage that is used as the input voltage for the second stage. In contrast, a "closed-loop mode of operation" for the first stage refers to an implementation of a duty cycle for the pulse-width modulation of the switching in the active phases that depends upon feedback from the intermediate output voltage or the output current from the first stage.

The phase shedding in the first stage may be controlled by the second stage. For example, the second stage may sense the total current (e.g., the total average current) in its active phases to determine a phase shedding command for the activation of the corresponding phases in the second stage. The number of active phases in the second stage from the phase shedding in response to the load may then be mapped into a corresponding number of phases to be activated in the first stage. The resulting phase shedding control of the first stage is thus dependent on the phase shedding in the second stage in such cross-domain phase shedding embodiments. Alternatively, the first stage may sense its total current from its active phases and determine its phase shedding independently of the phase shedding in the second state. Note that as used herein, "phase shedding" refers to an increase in the number of phases in a given stage in response to a change in the load. Regardless of whether the first stage phase shedding is controlled in a cross-domain fashion or independently of the second stage phase, the phase shedding transition in the first stage occurs during an open-loop-pulse-width-modulation transition period (denoted as a transition period herein for brevity) with an increase in clocking speed. Once the intermediate output voltage from the first stage has recovered sufficiently to its desired output level, the transition period is terminated, whereupon closed-loop pulse-width-modulation operation resumes.

Figure 1A:
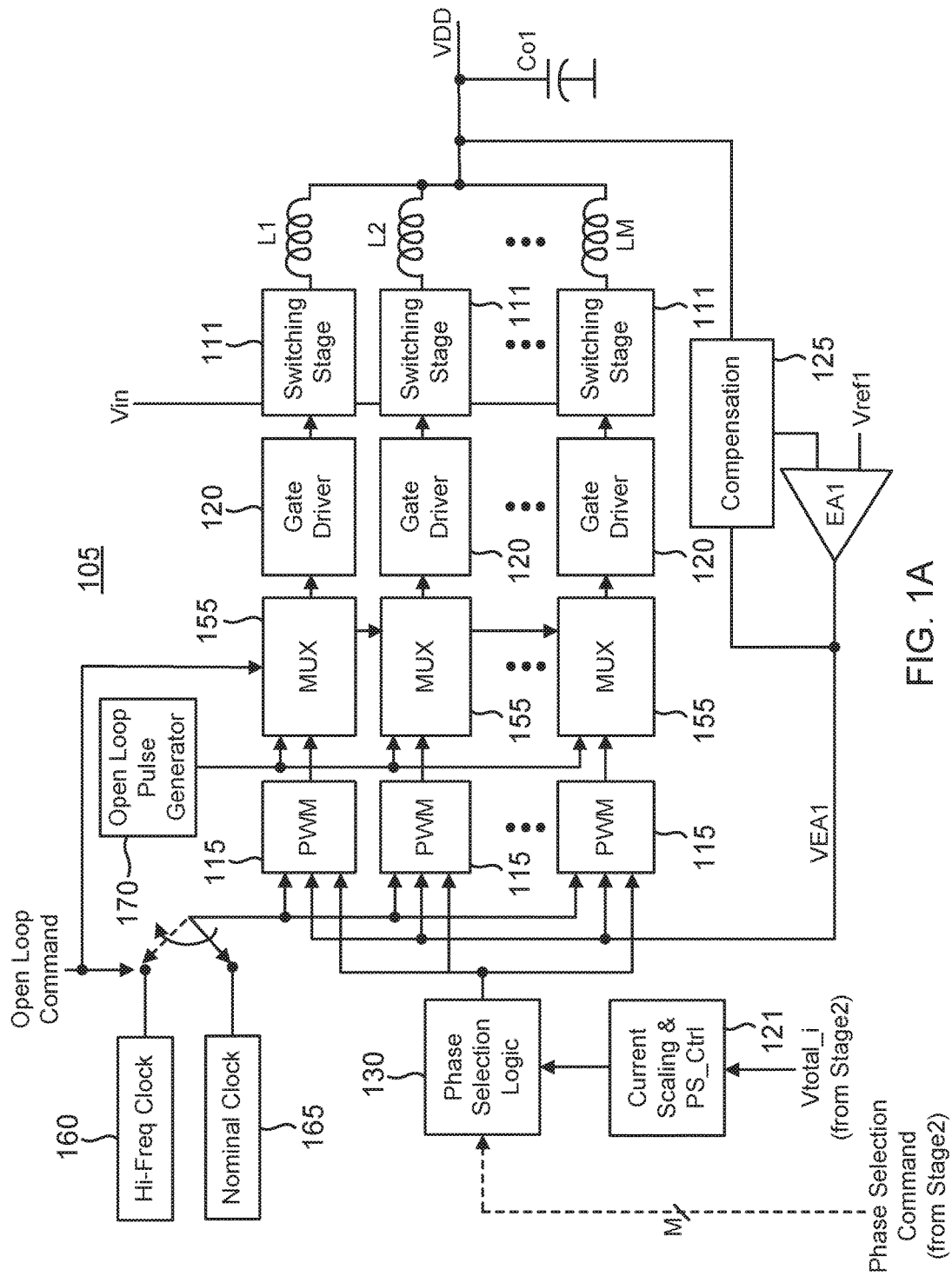
FIG. 1A illustrates a first stage for a multi-phase two-stage buck converter with increased response speed in accordance with an aspect of the disclosure.

An example first stage 105 for a two-stage multi-phase buck converter is shown in FIG. 1A. First stage 105 includes a plurality of M phases corresponding to M inductors ranging from a first inductor L1 to an Mth inductor LM. Each phase includes a switching stage 111 having its own high-side switch and a low-side switch (the switches are not shown for illustration clarity). When a phase's high-side switch closes, an input voltage Vin causes a magnetizing current to flow through the phase's inductor as is known in the buck converter arts. As is also known in the buck converter arts, each phase has its own pulse-width modulator (PWM) 115 and gate driver 120. Each pulse-width modulator 115 determines the duty cycle or pulse width for its switching stage 111 that is then implemented by the corresponding gate driver 120. The active phases all drive an intermediate voltage VDD filtered by a first-stage output capacitor Co1. The voltage VDD functions as the input voltage to the switching stages in a second-stage multi-phase buck converter as will be explained further herein.

During closed-loop operation, a first stage error amplifier EA1 that is compensated by a compensation network 125 compares a reference voltage Vref to the first stage output voltage VDD to generate a first stage error voltage VEA1 that is used by the pulse-width modulators 115 in the active phases for first stage 105 to control the pulse widths for the switching in these active phases. As compared to the second stage, first stage 105 operates at a lower switching frequency and larger step-down voltage ratio. First stage 105 thus includes an open-loop mode of operation as will be explained further herein to offer increased operating speed with regard to adapting to sudden load changes. A phase selection logic circuit 130 receives a phase selection command from the second stage 110 and activates the appropriate number of first stage phases as will be explained further herein. Since up to M phases can be activated in first stage 105, the phase selection command is an M-bit wide command with a bit corresponding to each phase. Should a phase's bit in the phase selection command be asserted, phase selection logic 130 activates the corresponding phase. In an alternative embodiment, first stage 105 may receive a Vtotal_i voltage from the second stage 110 that represents the total output current for second stage 110. Based upon the changes in the total output current, a current scaling and phase selection (PS) control circuit 121 in first stage 105 produces the phase selection command in such embodiments. In yet another alternative embodiment, there is no cross-domain dependency for the phase shedding in first stage 105 such that first stage 105 would base its phase shedding transitions on changes in its output current.

Figure 1B:
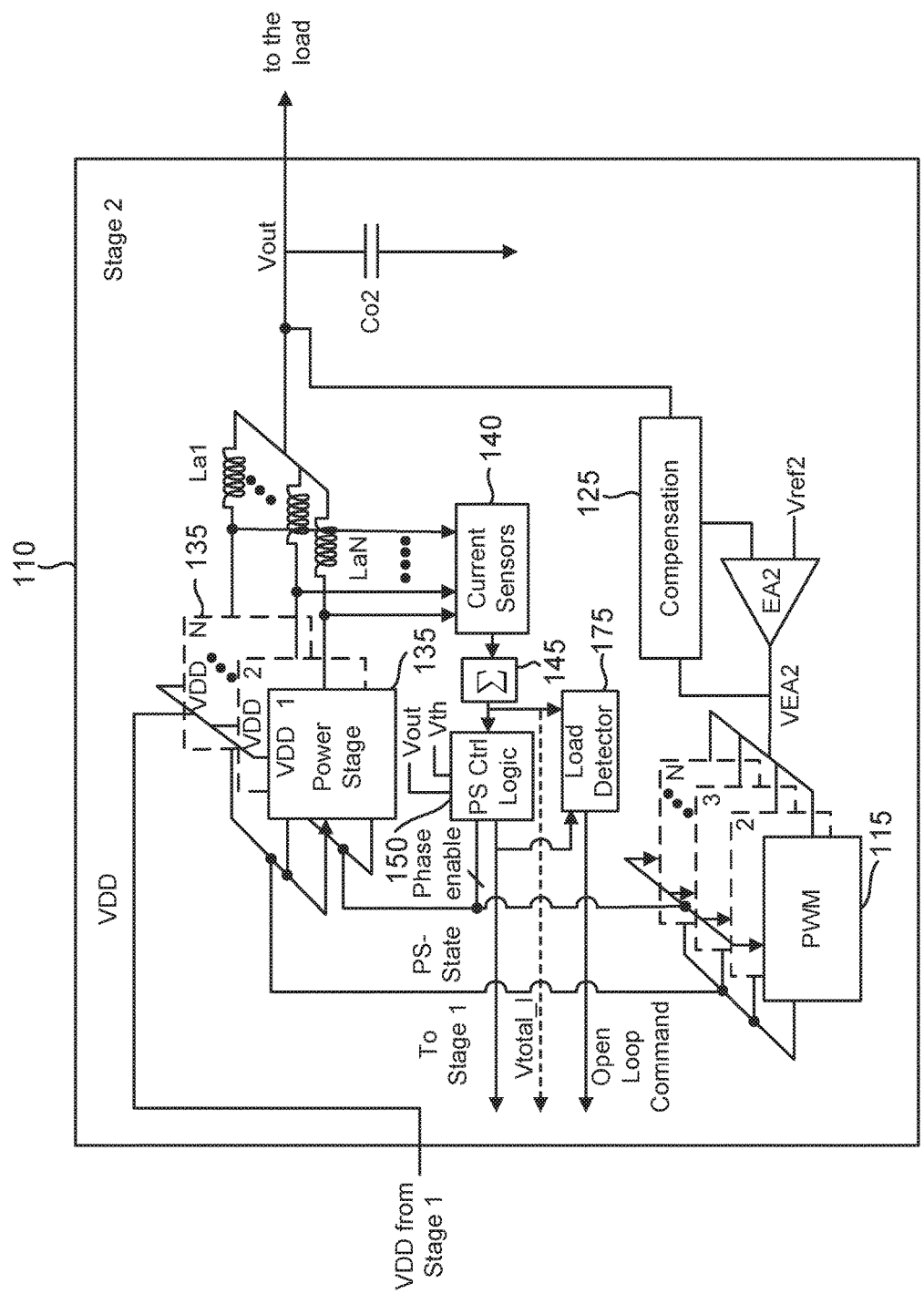
FIG. 1B illustrates a second stage for the multi-phase two-stage buck converter having the first stage of FIG. 1A in accordance with an aspect of the disclosure.

An example second stage 110 for completing the two-stage multi-phase buck converter is shown in FIG. 1B. Second stage 110 includes N phases, where N is independent of the number M for the phases in the first stage. Thus, N may be larger than, smaller than, or equal to M. Each phase has the same basic components as discussed with regard to first stage 105 such that each phase in second stage 110 includes an inductor, ranging from a first inductor La1 for a first phase to an Nth inductor LaN for an Nth phase. The inductors are all tied to an output terminal for an output voltage (Vout) as supported by an output capacitor Co2. Each phase also includes a gate driver that that controls the switching of a switching stage (for illustration clarity, each phase's switching stage and gate driver in second stage 110 are represented by a power stage 135). Power stages 135 in second-stage 110 drive a magnetizing current into their phase's inductor responsive to the output voltage VDD from first stage 105 whereas switching stages 111 in first stage 105 do so with regard to the input voltage Vin. The switching in each power stage 135 is pulse-width modulated by a corresponding PWM 115. A second stage error amplifier EA2 compares a second stage reference voltage Vref2 to the output voltage Vout to generate a second stage error voltage VEA2. As discussed with regard to first stage error amplifier EA1, second stage error amplifier EA2 includes a compensation network 125. Each PWM 115 in second stage 110 adjusts the pulse width modulation of its power stage 135 responsive to the second stage error voltage VEA2 during closed-loop operation of second stage 110.

A current sensor 140 senses the inductor currents in the active second stage phases. For example, current sensor 140 may be configured to convert each sensed current into a voltage. The various voltages for the active phases are then summed as represented by a summing circuit 145 to obtain the total current for the active phases. In general, the inductor current for an active phase ramps up and down depending upon whether the high side switch or the low side switch in the corresponding power stage 135 is on or off. Current sensor 140 may thus sense the average current such that the total current from summing circuit 145 is the average total output current for the active phases. Alternatively, current sensor 140 may sense the peak inductor currents such that the total current from summing circuit 145 is the peak total output current for the active phases.

Figure 2:
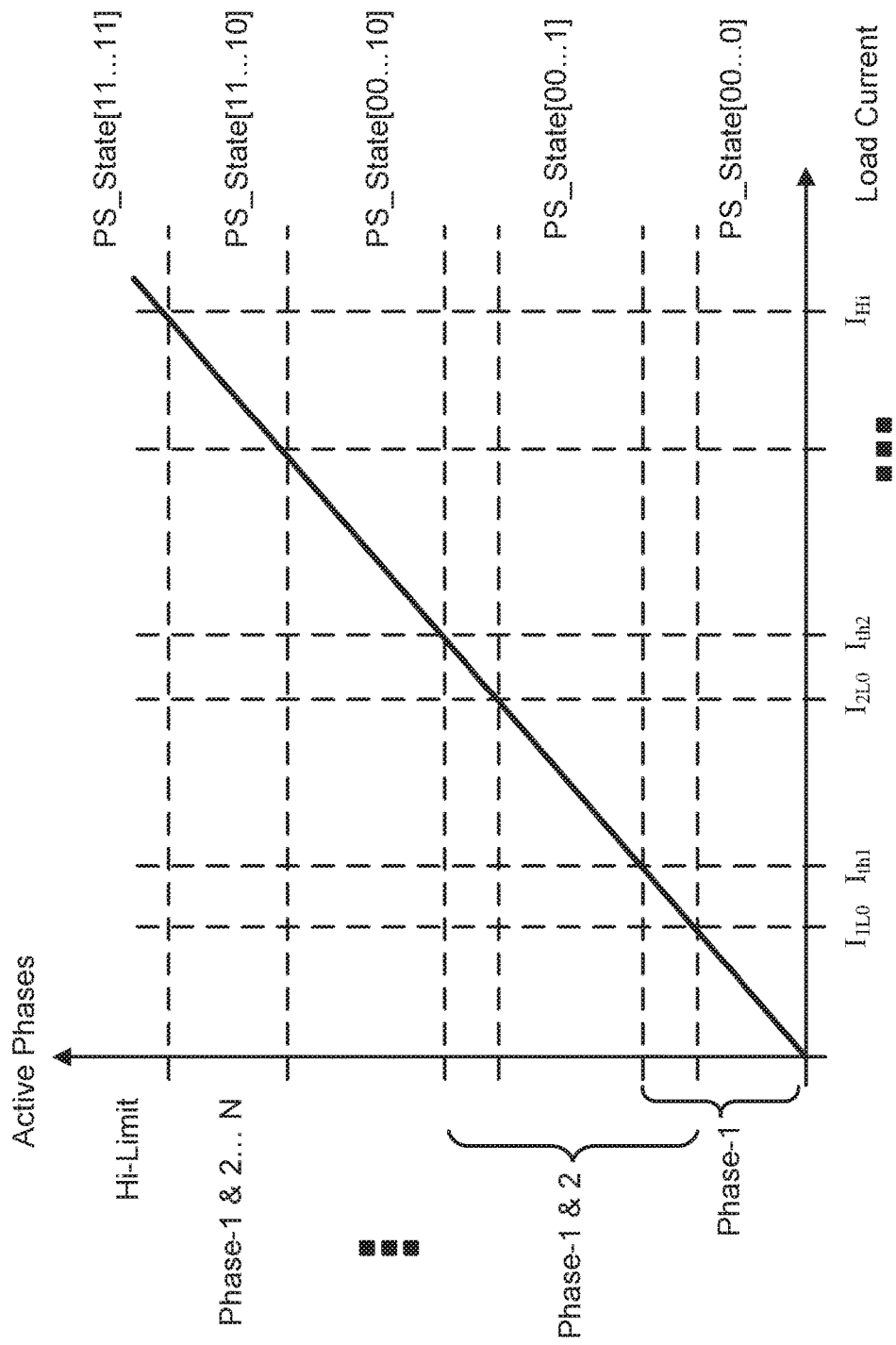
FIG. 2 is a plot of load current versus the phase activations for the phase shedding control circuit of FIG. 1B.

A phase shedding control circuit 150 controls the phase shedding or activation of the phases in second stage 110 responsive to the total current from summing circuit 145. For example, phase shedding control circuit 150 may be configured to compare the total current to various thresholds to control which phases are activated. Some example thresholds are shown in FIG. 2. Starting from a low load state, the total current is less than a first high threshold current $I_{th1}$ so that phase shedding control circuit 150 activates only a first phase 1. For example, phase shedding control circuit 150 may generate a phase shedding state variable PS_State equaling all zeroes PS_State[00 . . . 0] to activate the first phase. In response to the current rising above the $I_{th1}$ threshold but remaining below a second high threshold current $I_{th2}$, phase shedding control circuit 150 changes the phase shedding state variable so that its LSB is binary high (PS_State[00 . . . 1]) to activate a second phase 2 as well. In this fashion, phase shedding control logic circuit 150 may continue to activate additional phases as the current rises above the corresponding thresholds. To reduce the effects of noise, phase shedding control circuit 150 uses hysteresis such that low current thresholds govern the de-activation of phases. For example, if the current drops below a low current threshold $I_{2Lo}$, phase shedding control circuit 150 changes the phase shedding state variable to again equal all zeroes so that only phase 1 is active.

The phase-shedding control implemented by phase shedding control logic circuit 150 in second stage 110 may control the phase shedding in first stage 105 (FIG. 1A) such that phase shedding control logic circuit 150 generates the phase shedding command that controls the phase shedding implemented by phase selection logic circuit 130 in first stage 105. Alternatively, first stage 105 may control its own phase shedding independently of second stage 110. Since the output power for both stages is approximately equal, the current ratio between the two stages is constant and is proportional to the voltage ratio and the second stage efficiency. Thus, the activation of a given number of phases in second stage 110 by phase shedding control logic circuit 150 may be mapped into a corresponding number of phases for activation in first stage 105. In particular, it may be shown that the number of active phases ($PH_{1\_Active}$) in first stage 105 based upon the number of active phases ($PH_{2\_Active}$) is given by the following equation (1):

$$PH_{1\_Active} = (Vout2/\eta_2 * VDD) * (N/M) * PH_{2\_Active} \quad \text{Eq. (1)}$$

where Vout2 is the output voltage from second stage 110, VDD is the output voltage from first stage 105, $\eta_2$ is the second stage efficiency, N is the total number of phases in second stage 110, and M is the total number of phases in first stage 105. The phase shedding in second stage 110 would thus be mapped to a corresponding number of activated phases in first stage 105. In an alternative embodiment, current scaling and phase selection control circuit 121 in first stage 105 receives the Vtotal_I signal as generated by summing circuit 145. Current scaling and phase selection control circuit 121 may then operate as discussed with regard to FIG. 2 and phase shedding control logic circuit 150 to generate the phase shedding command. Alternatively, there may be no cross-domain dependence on the phase shedding implemented by first stage 105 as discussed previously.

To advantageously increase the response speed of first stage 105 despite its relatively-slow closed-loop clocking frequency, the pulse width modulation command to each gate driver 120 is selected for by a corresponding multiplexer 155 that is responsive to an open loop command that is asserted in response to a sudden increase in load. For example, second stage 110 may include a load detector 175 that compares the peak average current from summing circuit 145 to a previous version of the peak average current (for example, the previous version of the peak average current may have been summed by summing circuit 145 a certain number of clock cycles before the current measurement). Should the peak average current exceed by a threshold amount over the delayed version of the peak average current, load detector 175 asserts the open loop command. Such a sudden application of a load will cause phase shedding transitions in both stages 105 and 110. Thus, the open loop command may instead be asserted by phase shedding control logic circuit 150 in conjunction with the activation of additional phases in second stage 110 in alternative embodiments.

Regardless of how the open loop command is generated, it controls whether first stage 105 operates in a closed-loop mode of operation or instead operates in an open-loop mode of operation during an open-loop mode transition period in conjunction with the activation of additional phases. If the open loop command is not asserted, each phase's multiplexer 155 selects for the output of the corresponding PWM 115 to drive the phase's gate driver 120 as shown in FIG. 1A. The resulting pulse width modulation of the switching in the first stage's switching stages 111 would thus be under closed-loop control through the feedback from the first error amplifier EA1. Conversely, each phase's multiplexer 155 selects for the output of an open loop pulse generator 170 should the open loop command be asserted. During open loop operation, the duty cycle (pulse width) of the switching in each switching stage 111 for each active phase is forced to a high level such as a 90% duty cycle, a 95% duty cycle, or even a 100% duty cycle. Such a maximum pulse width enables each active phase to deliver as much current as possible to the output node carrying the output voltage VDD from first stage 105 to second stage 110. In this fashion, the output voltage VDD may quickly recover to its steady-state value following the phase-shedding increase in the number of active phases. During closed-loop operation, a default or nominal clock signal 165 clocks each active PWM 115 such as implemented through a switch controlled by a de-assertion of the open loop command. The switching period during closed-loop operation is thus determined by the relatively-slow rate of nominal clock signal 165. In contrast, the assertion of the open loop command forces the switch to select for a high-frequency clock signal 160 to clock the active PWMs 115 so that the switching period during the open-loop transition period is shorter than during steady-state operation so that first stage 105 may advantageously respond quickly to load transients.

Figure 3A:
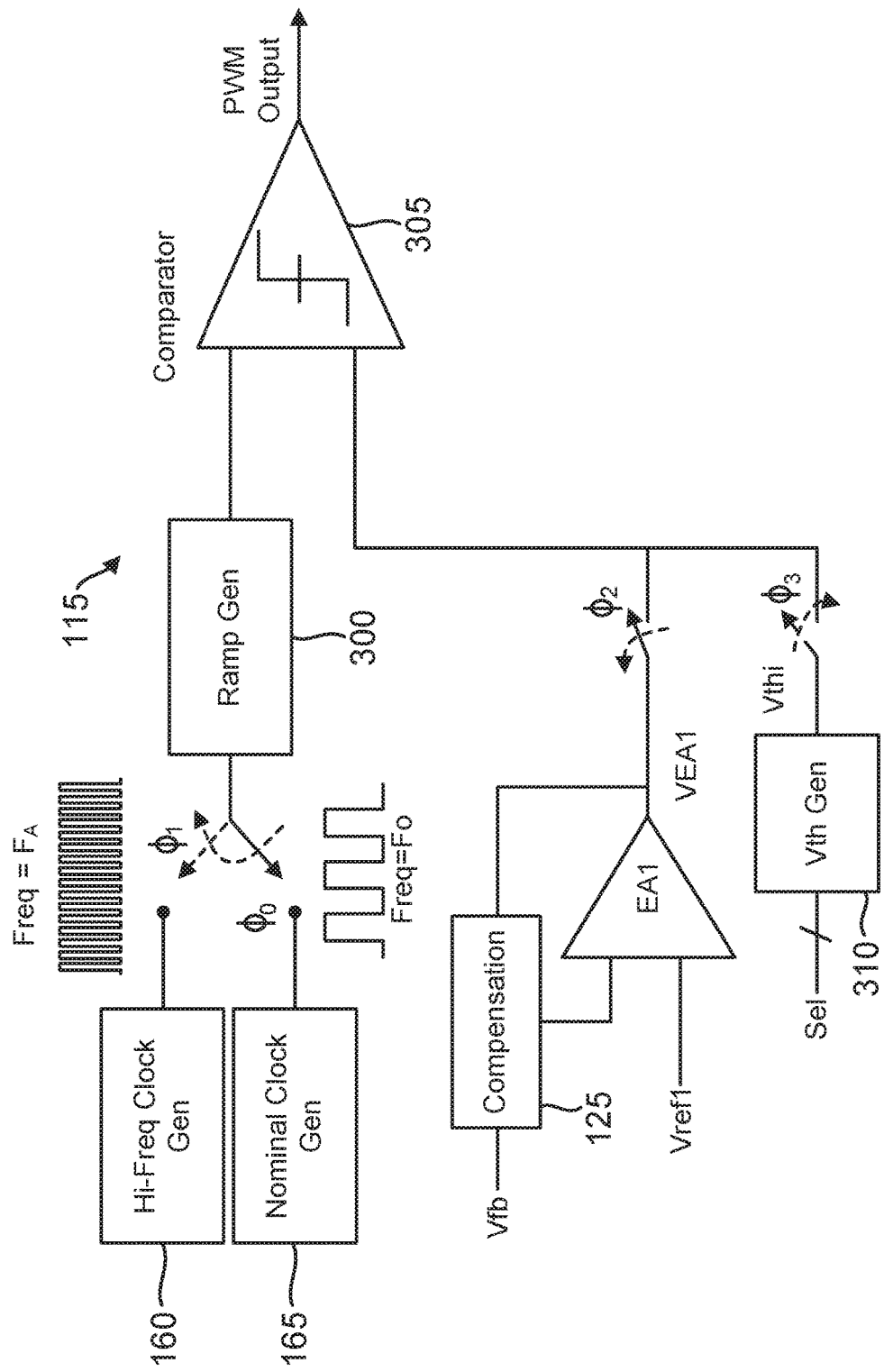
FIG. 3A illustrates a voltage-mode pulse-width modulator (PWM) for a modification of the first stage of FIG. 1A in which the PWM directly drives the gate driver without an intervening multiplexer in accordance with an aspect of the disclosure.
Figure 4:
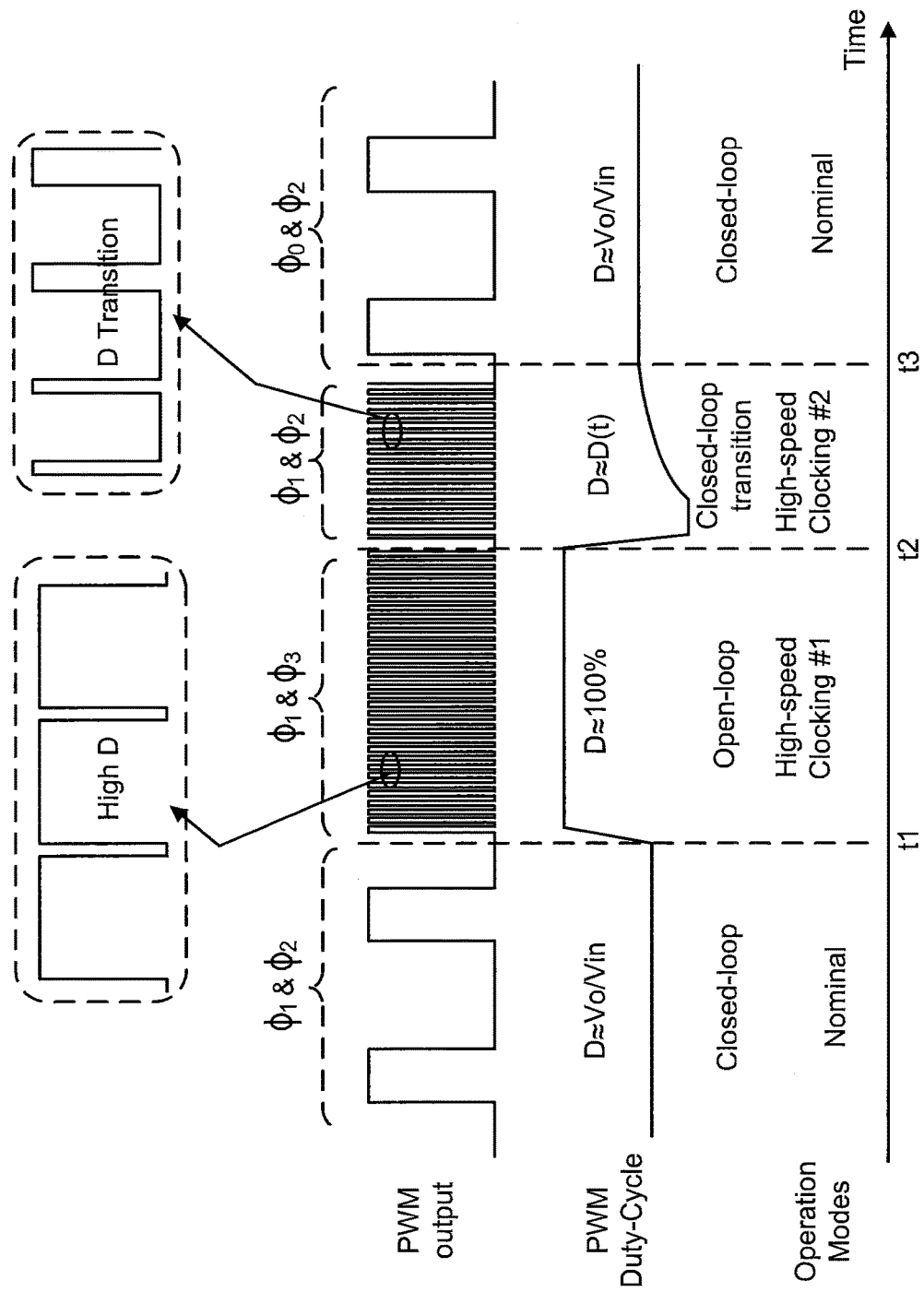
FIG. 4 illustrates some waveforms for the PWM of FIG. 3A.

Note that first stage 105 may be modified to eliminate multiplexer 155 and open loop pulse generator 170. An example PWM 115 for such an embodiment is shown in FIG. 3A. PWM 115 includes a ramp generator 300 that generates a ramp signal having a period determined by a variable clock signal. During closed-loop operation (designated as a switch position $\Phi_0$), nominal clock signal 165 clocks ramp generator 300 so that the switching frequency during closed-loop operation is the nominal (relatively slow) value. PWM 115 also includes a comparator 305 that compares the ramp signal from ramp generator to the error signal EA1 from first error amplifier EA1 during closed-loop operation responsive to a closing of a switch $\Phi_2$ to generate the PWM output for the switching in the corresponding active phase. The pulse width and duty cycle during closed-loop operation thus depends upon feedback through the first error amplifier EA1. As discussed with regard to FIG. 1A, first error amplifier EA1 is compensated by a compensation network 125. The PWM output from PWM 115 as well as its duty cycle and operation modes are plotted as a function of time in FIG. 4. Nominal or closed-loop operation corresponding to switch positions $\Phi_0$ and $\Phi_2$ result in a nominal duty cycle of Vo/Vin (Vo being the output voltage VDD from first stage 105). Referring again to FIG. 3A, high-frequency clock signal 160 clocks ramp generator 115 through activation of a switch position $\Phi_1$ in response to a load increase and activation of additional phases to begin the open-loop mode of operation. During the open-loop mode of operation, comparator 305 compares the ramp signal from ramp generator 300 to a threshold voltage Vthi from a threshold voltage (Vth) generator 310 in response to a closing of a switch $\Phi_3$ and the opening of switch $\Phi_2$. For example, Vthi may equal a voltage less than or equal to a minimum voltage (e.g., ground) of the ramp signal to ensure that a 100% duty cycle in produced. To provide some adaptability, threshold generator 310 may be responsive to a selection signal (Sel) so that other relatively-high duty cycles (e.g., 90% or 95%) may be implemented during the open loop mode of operation depending upon a tuning of the selection signal. As seen in FIG. 4, the open-loop operation extends from a time t1 to a time t2. To ease that transition back to closed-loop operation, the open-loop operation may be followed by a closed-loop transition period from time t2 to a time t3. During this closed-loop transition period, ramp generator 300 continues to be clocked with high-frequency clock signal 160 through switch position $\Phi_1$ but switch $\Phi_3$ is opened and switch $\Phi_2$ closed so that ramp generator receives the first error signal voltage VEA1 to resume closed-loop operation but with a clocking period determined by high-frequency clock signal 160. At time t3, nominal or closed-loop operation begins again with switch positions $\Phi_0$ and $\Phi_2$.

Figure 3B:
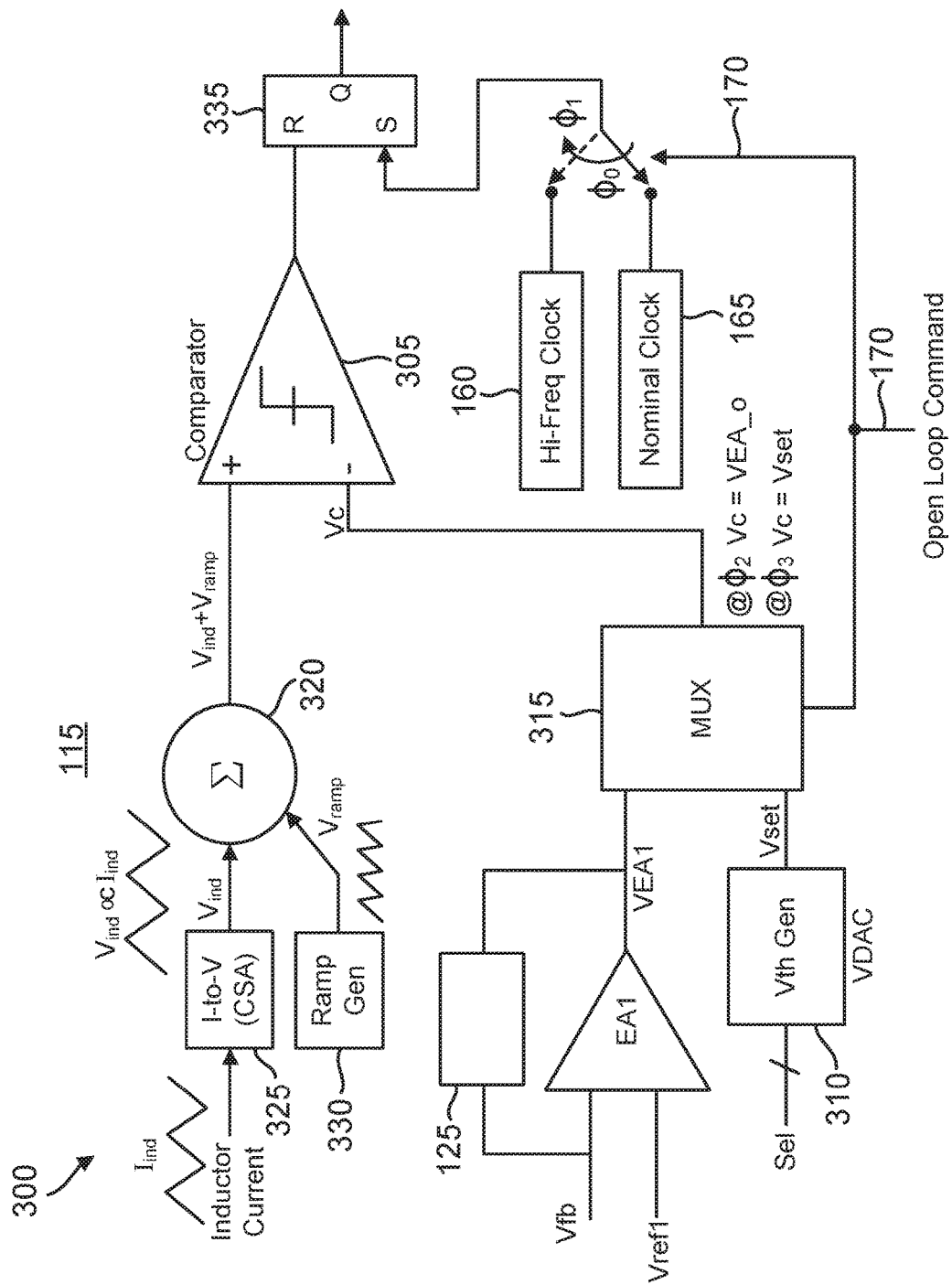
FIG. 3B illustrates a current-mode pulse-width modulator (PWM) for a modification of the first stage of FIG. 1A in which the PWM directly drives the gate driver without an intervening multiplexer in accordance with an aspect of the disclosure.

In an alternative embodiment, the two-stage multi-phase buck converter may be a current-mode converter. PWM 115 for a current-mode embodiment in first stage 105 is shown in FIG. 3B. During close-loop operation, a multiplexer 315 selects for the output of first error amplifier EA1 to provide an input to comparator 305 as discussed in FIG. 3A corresponding to switch position $\Phi_2$ But in a current-mode converter, the ramp signal is provided by the inductor current itself (Iind), which is converted into a voltage signal (Vind) in a current-to-voltage (I-V) current sense amplifier (CSA) 325. To provide sub-harmonic compensation, the output from CSA 325 is added with a ramp signal Vramp from a ramp generator 330 in an adder 320 to form a combined signal Vind+Vramp that is compared by comparator 305 to the output Vc from multiplexer 315. When the combined signal is greater than Vc, comparator 305 resets an RS latch 335 that is set by a clock signal selected responsive to the open loop command 170. Should the open loop command 170 be de-asserted to select for closed-loop operation, nominal clock signal 165 sets RS latch 335. Conversely, high-frequency clock signal sets RS latch 335 during open-loop operation. The gate driver 120 (FIG. 1A) controls the pulse-width modulation of the switching for the corresponding phase responsive to the output of the phase's RS latch 335. Multiplexer 315 is also responsive to the open loop command 170 such that during open-loop operation, the output Vc from multiplexer 315 is controlled by a threshold voltage (Vth) generator 310 (e.g., a VDAC) analogously as discussed with regard to FIG. 3A.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A two-stage multi-phase switching power converter, comprising:
   a first stage including:
      a plurality of first-stage phases configured to convert an input voltage into an intermediate output voltage;
      a phase selection control circuit configured to activate an active number of first-stage phases selected from the plurality of first-stage phases responsive to an application of a load, wherein each first-stage phase includes a first-stage pulse-width modulator responsive to a first clock signal having a nominal frequency during a nominal mode of operation prior to the application of the load and having an increased frequency during a transition period responsive to the application of the load, wherein the increased frequency is greater than the nominal frequency; and
   a second stage including a plurality of second-stage phases configured to convert the intermediate output voltage into an output voltage, wherein each second-stage phase includes a second-stage pulse-width modulator responsive to a second clock signal having a second frequency that is greater than the nominal frequency.

2. The two-stage multi-phase switching power converter of claim 1, wherein each first-stage pulse-width modulator is configured to pulse-width modulate responsive to an error signal during the nominal mode of operation and is configured to pulse-width modulate using a fixed duty cycle during the transition period.

3. The two-stage multi-phase switching power converter of claim 2, wherein the fixed duty cycle is greater than 90%.

4. The two-stage multi-phase switching power converter of claim 2, wherein the fixed duty cycle is 100%.

5. The two-stage multi-phase switching power converter of claim 2, wherein the first stage further includes an error amplifier configured to amplify a difference between a compensated version of the intermediate output voltage to a reference voltage to generate the error signal.

6. The two-stage multi-phase switching power converter of claim 1, wherein the phase selection control circuit is responsive to a phase shedding command from the second stage.

7. The two-stage multi-phase switching power converter of claim 6, wherein the second stage includes a phase selection control logic circuit configured to generate the phase shedding command responsive to an output current for the second stage.

8. The two-stage multi-phase switching power converter of claim 1, wherein the phase selection control circuit is responsive to an output current for the first stage.

9. The two-stage multi-phase switching power converter of claim 1, wherein each first-stage phase includes:
   a gate driver;
   an open loop pulse generator; and
   a multiplexer, wherein the multiplexer is configured to select for an output signal from the first stage phase's first-stage pulse-width modulator during the nominal operation to provide an input signal to the gate driver and to select for an output signal from the open loop pulse generator during the transition period to provide the input signal to the gate driver.

10. The two-stage multi-phase switching power converter of claim 2, wherein each first-stage pulse-width modulator includes:
    a ramp generator configured to be clocked by the first clock signal to generate a ramp signal; and
    a comparator configured to compare a control voltage to the ramp generator to produce a pulse-width modulation control signal.

11. The two-stage multi-phase switching power converter of claim 10, wherein each first-stage pulse-width modulator further includes:
    an error amplifier configured to generate the control voltage during the nominal mode of operation; and
    a threshold voltage generator configured to generate the control voltage during the transition period.

12. The two-stage multi-phase switching power converter of claim 10, wherein each first-stage pulse-width modulator further includes:
    a current-to-voltage converter configured to convert an inductor current into a voltage signal; and
    a comparator configured to compare the inductor current to a control voltage to produce a pulse-width modulation control signal.

13. The two-stage multi-phase switching power converter of claim 12, wherein each first-stage pulse-width modulator further includes:
    an error amplifier configured to generate the control voltage during the nominal mode of operation; and
    a threshold voltage generator configured to generate the control voltage during the transition period.

14. The two-stage multi-phase switching power converter of claim 1, wherein the two-stage multi-phase switching power converter is a two-stage multi-phase buck converter.

15. The two-stage multi-phase switching power converter of claim 1, wherein the increased frequency is at least ten times greater than the nominal frequency.

16. A method of operation for a two-stage multi-phase switching power converter, comprising:
    during a nominal mode of operation:
      in a first stage, converting an input voltage into an intermediate output voltage by pulse-width modulating a first number of first-stage phases according to a nominal clocking frequency;
      in a second stage converting the intermediate output voltage into an output voltage by pulse-width modulating a second number of second-stage phases according to a second-stage clocking frequency that is greater than the nominal clocking frequency; and
    in response to an application of a load, transitioning from the nominal mode of operation over a transition period by pulse-width modulating a third number of first-stage phases according to an increased clocking frequency and by pulse-width modulating a fourth number of second-stage phases according to the second-stage clocking frequency, wherein the third number is greater than the first number, the fourth number is greater than the second number, and the increased clocking frequency is greater than the nominal clocking frequency.

17. The method of operation of claim 16, wherein during the nominal mode of operation the pulse-width modulating of the first number of first-stage phases is responsive to a feedback from the intermediate output voltage, and wherein during the transition period the pulse-width modulating of the third number of first-stage phases is responsive to a fixed duty cycle.

18. The method of operation of claim 17, wherein the fixed duty cycle is greater than 90%.

19. The method of operation of claim 17, wherein the fixed duty cycle is 100%.

* * * * *